(12) United States Patent
Otsubo et al.

(10) Patent No.: US 12,309,913 B2
(45) Date of Patent: May 20, 2025

(54) MODULE

(71) Applicant: Murata Manufacturing Co., Ltd., Nagaokakyo (JP)

(72) Inventors: Yoshihito Otsubo, Nagaokakyo (JP); Ryoichi Kita, Nagaokakyo (JP); Tadashi Nomura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 247 days.

(21) Appl. No.: 17/936,051

(22) Filed: Sep. 28, 2022

(65) Prior Publication Data

US 2023/0015008 A1 Jan. 19, 2023

Related U.S. Application Data

(63) Continuation of application No. PCT/JP2021/013334, filed on Mar. 29, 2021.

(30) Foreign Application Priority Data

Apr. 7, 2020 (JP) .................................. 2020-069216

(51) Int. Cl.
*H05K 1/02* (2006.01)
*H01L 21/56* (2006.01)
(Continued)

(52) U.S. Cl.
CPC ......... *H05K 1/0216* (2013.01); *H05K 1/0243* (2013.01); *H05K 2201/10098* (2013.01)

(58) Field of Classification Search
CPC ...... H05K 1/02; H05K 1/0216; H05K 1/0218; H05K 1/0224; H05K 1/023; H05K 1/0243; H05K 1/115; H05K 1/144; H05K 1/181; H05K 1/183; H05K 3/0011; H05K 3/0052; H05K 3/40; H05K 3/46; H05K 3/284; H05K 3/303; H05K 3/4694; H05K 7/20; H05K 9/00; H05K 9/0015; H05K 9/0022;
(Continued)

(56) References Cited

U.S. PATENT DOCUMENTS 8,849,362 B1 * 9/2014 Saji .................... H05K 1/0218
257/659
10,629,542 B2 * 4/2020 Hong .................... H05K 1/023
(Continued)

FOREIGN PATENT DOCUMENTS

JP 2005-251827 A 9/2005
JP 2010-258137 A 11/2010
(Continued)

OTHER PUBLICATIONS

International Search Report for PCT/JP2021/013334 dated Jun. 8, 2021.

*Primary Examiner* — Xiaoliang Chen
(74) *Attorney, Agent, or Firm* — McDonald Hopkins LLC

(57) ABSTRACT

A module includes: a substrate having a first face; a plurality of components mounted on the first face; a resin film that covers the plurality of components along contours of the plurality of components and also covers a part of the first face; and a shield film formed to overlap the resin film. The first face is provided with a ground electrode. The resin film has an opening, and the shield film is connected to the ground electrode via the opening.

19 Claims, 18 Drawing Sheets

(51) Int. Cl.
| | |
|---|---|
| *H01L 21/762* | (2006.01) |
| *H01L 23/00* | (2006.01) |
| *H01L 23/12* | (2006.01) |
| *H01L 23/28* | (2006.01) |
| *H01L 23/31* | (2006.01) |
| *H01L 23/552* | (2006.01) |
| *H01L 23/66* | (2006.01) |
| *H01L 25/04* | (2023.01) |
| *H01L 25/16* | (2023.01) |
| *H05K 3/40* | (2006.01) |
| *H05K 3/46* | (2006.01) |
| *H05K 7/20* | (2006.01) |
| *H05K 9/00* | (2006.01) |

(58) Field of Classification Search
CPC .. H05K 9/0024; H05K 9/0039; H05K 9/0084; H05K 2201/10098; H01L 21/56; H01L 21/561; H01L 21/565; H01L 21/762; H01L 23/00; H01L 23/12; H01L 23/28; H01L 23/31; H01L 23/66; H01L 23/284; H01L 23/315; H01L 23/552; H01L 23/3121; H01L 23/3135; H01L 23/4334; H01L 23/5386; H01L 25/04; H01L 25/0655; H01L 25/16; H01L 25/50
USPC ........... 361/760, 728, 736, 764, 765, 816; 174/760, 728, 736, 764, 765, 816, 256, 174/261, 377, 538, 546; 455/73, 550.1, 455/552.1, 575.1; 257/659, 660, 724; 29/825, 836, 841, 852
See application file for complete search history.

(56) References Cited

U.S. PATENT DOCUMENTS

| | | | | |
|---|---|---|---|---|
| 10,665,568 | B2* | 5/2020 | Miwa | H05K 9/0088 |
| 2002/0129957 | A1* | 9/2002 | Kolb | H01L 23/552 |
| | | | | 257/E23.116 |
| 2002/0129971 | A1* | 9/2002 | Kolb | H05K 9/0039 |
| | | | | 174/256 |
| 2003/0076459 | A1* | 4/2003 | Murade | G02F 1/133512 |
| | | | | 349/111 |
| 2005/0042804 | A1* | 2/2005 | Kim | H03H 3/08 |
| | | | | 438/110 |
| 2006/0113642 | A1* | 6/2006 | Kajiki | H01L 25/165 |
| | | | | 257/E23.079 |
| 2006/0244131 | A1* | 11/2006 | Kobayashi | H01L 23/3135 |
| | | | | 257/E23.114 |
| 2008/0210462 | A1* | 9/2008 | Kawagishi | H01L 24/97 |
| | | | | 29/841 |
| 2009/0002967 | A1* | 1/2009 | Asami | H01L 23/552 |
| | | | | 257/E23.114 |
| 2009/0029506 | A1* | 1/2009 | Fujii | H01L 23/3121 |
| | | | | 257/E21.502 |
| 2009/0091904 | A1* | 4/2009 | Hatanaka | H01L 23/552 |
| | | | | 361/764 |
| 2009/0321122 | A1* | 12/2009 | Mori | H01R 13/6586 |
| | | | | 29/852 |
| 2010/0027225 | A1* | 2/2010 | Yuda | H05K 3/4697 |
| | | | | 156/247 |
| 2011/0006106 | A1* | 1/2011 | Kanryo | H01L 25/165 |
| | | | | 228/170 |
| 2011/0248389 | A1* | 10/2011 | Yorita | H01L 25/0652 |
| | | | | 257/659 |
| 2011/0298111 | A1* | 12/2011 | Kim | H01L 21/561 |
| | | | | 257/E23.114 |
| 2012/0020039 | A1 | 1/2012 | Coffy et al. | |
| 2012/0187551 | A1* | 7/2012 | Kushino | H01L 24/97 |
| | | | | 257/659 |
| 2013/0082367 | A1* | 4/2013 | Yoo | H01L 25/0655 |
| | | | | 438/584 |
| 2014/0048916 | A1* | 2/2014 | Lin | H01L 24/82 |
| | | | | 257/659 |
| 2014/0204550 | A1* | 7/2014 | Kataoka | H05K 3/284 |
| | | | | 361/765 |
| 2015/0016066 | A1* | 1/2015 | Shimamura | H05K 1/0216 |
| | | | | 29/841 |
| 2015/0119102 | A1* | 4/2015 | Saji | H01L 23/5384 |
| | | | | 455/550.1 |
| 2017/0098637 | A1* | 4/2017 | Hamada | H01L 23/3135 |
| 2017/0256474 | A1* | 9/2017 | Fujinaga | H01L 23/3121 |
| 2017/0345789 | A1* | 11/2017 | Miwa | H01L 21/6715 |
| 2017/0347462 | A1* | 11/2017 | Miwa | H01L 21/561 |
| 2018/0077829 | A1* | 3/2018 | Yamamoto | B32B 15/08 |
| 2018/0090449 | A1* | 3/2018 | Jeong | H01L 23/552 |
| 2018/0092201 | A1* | 3/2018 | Otsubo | H01L 23/5386 |
| 2018/0092257 | A1* | 3/2018 | Otsubo | H05K 1/181 |
| 2018/0159216 | A1 | 6/2018 | Kai et al. | |
| 2018/0199428 | A1* | 7/2018 | Otsubo | H05K 1/0243 |
| 2018/0204781 | A1* | 7/2018 | Otsubo | H01L 23/552 |
| 2018/0277490 | A1* | 9/2018 | Yoon | H01L 23/3135 |
| 2018/0323128 | A1* | 11/2018 | Dias | H01L 23/3128 |
| 2019/0051611 | A1* | 2/2019 | Kim | H01L 23/3128 |
| 2019/0103653 | A1 | 4/2019 | Jeong et al. | |
| 2019/0274212 | A1* | 9/2019 | Otsubo | H05K 1/0216 |
| 2019/0274237 | A1* | 9/2019 | Otsubo | H05K 3/284 |
| 2019/0311994 | A1* | 10/2019 | Hong | H01L 21/56 |
| 2019/0348372 | A1* | 11/2019 | Jun | H01L 25/50 |
| 2019/0363055 | A1* | 11/2019 | Yazaki | H01L 23/3121 |
| 2019/0393162 | A1* | 12/2019 | Jun | H01L 23/3121 |
| 2020/0036086 | A1* | 1/2020 | Yazaki | H01Q 1/243 |
| 2020/0043866 | A1* | 2/2020 | Fujii | H01L 25/0652 |
| 2020/0286839 | A1* | 9/2020 | Jang | H01L 21/4875 |
| 2020/0323077 | A1* | 10/2020 | Han | H05K 3/0011 |
| 2021/0193587 | A1* | 6/2021 | Yada | H01L 21/56 |
| 2022/0418089 | A1* | 12/2022 | Nomura | H01L 23/562 |
| 2023/0198478 | A1* | 6/2023 | Kitajima | H04B 1/40 |
| | | | | 455/73 |
| 2023/0198556 | A1* | 6/2023 | Uejima | H01L 23/28 |
| | | | | 455/552.1 |
| 2024/0014121 | A1* | 1/2024 | Otsubo | H01L 23/3121 |

FOREIGN PATENT DOCUMENTS

| | | |
|---|---|---|
| JP | 2018-093014 A | 6/2018 |
| JP | 2019-021757 A | 2/2019 |
| WO | 2018/194012 A1 | 10/2018 |

* cited by examiner

MODULE

CROSS REFERENCE TO RELATED APPLICATION

This is a continuation of International Application No. PCT/JP2021/013334 filed on Mar. 29, 2021 which claims priority from Japanese Patent Application No. 2020-069216 filed on Apr. 7, 2020. The contents of these applications are incorporated herein by reference in their entireties.

BACKGROUND OF THE DISCLOSURE

Field of the Disclosure

The present invention relates to a module.

Description of the Related Art

US 2019/0103653 A1 (PTL 1) describes a structure of an antenna module. In this antenna module, electronic components such as RFIC are mounted on one surface of a multilayer substrate, and a mold resin is formed so as to seal these electronic components. A shield film is formed to cover the upper surface and the side surface of the mold resin.

PTL 1: US 2019/0103653 A1

BRIEF SUMMARY OF THE DISCLOSURE

Such an antenna module or a high frequency module needs to have further enhanced shielding performance. In addition, a reduction in height is also required.

In view of this, an object of the present invention is to provide a module capable of enhancing shielding performance and achieving a reduction in height.

In order to achieve the above object, a module according to the present invention includes: a substrate having a first face; a plurality of components mounted on the first face; a resin film that covers the plurality of components along contours of the plurality of components and also covers a part of the first face; and a shield film formed to overlap the resin film. The first face is provided with a ground electrode. The resin film has an opening. The shield film is connected to the ground electrode via the opening.

According to the present invention, the shield film is formed to overlap the resin film disposed along the contours of the plurality of components, and thus, the shielding performance of the entire module can be enhanced and the height can be reduced.

DETAILED DESCRIPTION OF THE DISCLOSURE

Figure 1:
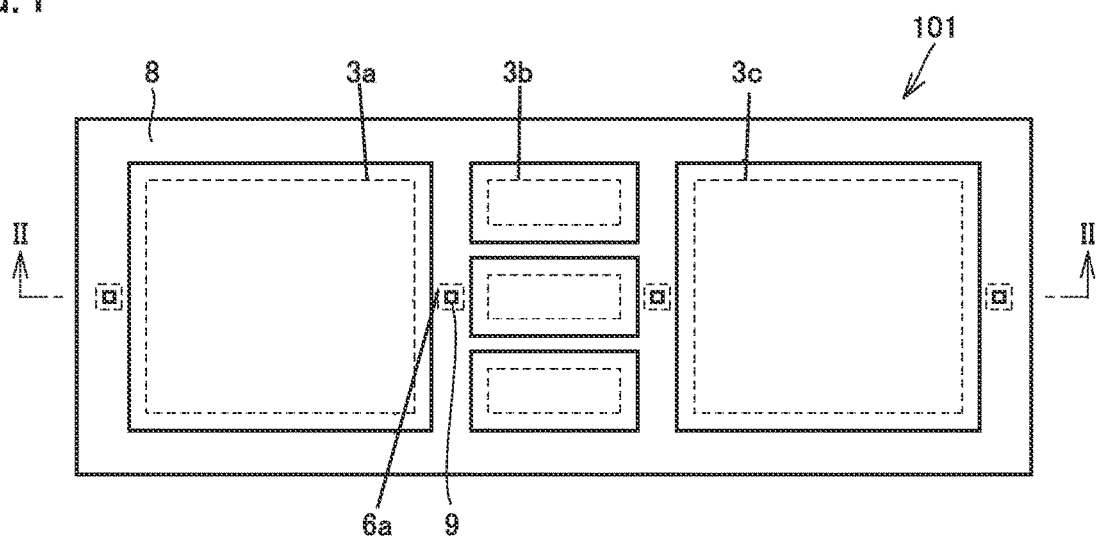
FIG. 1 is a plan view of a module according to a first embodiment of the present invention.

The dimensional ratios illustrated in the drawings do not necessarily represent the actual dimensional ratios, and the dimensional ratios may be exaggerated for convenience of description. In the following description, while referring to the positional concept of "upper" ("above" or "upward") or "lower" ("below" or "downward"), it does not necessarily mean the absolute position of "upper" ("above" or "upward") or "lower" ("below" or "downward"), and may mean the relative position of "upper" ("above" or "upward") or "lower" ("below" or "downward") in relation to the orientations of the elements in the drawings.

First Embodiment

Figure 2:
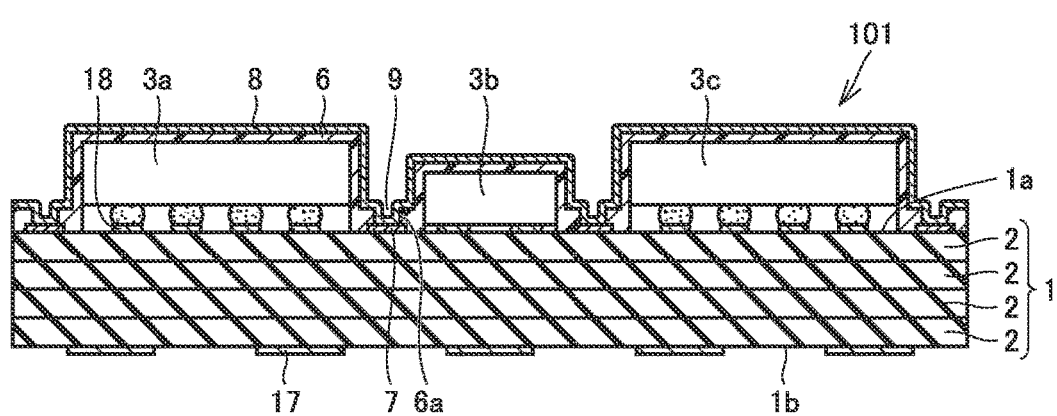
FIG. 2 is a cross-sectional view taken along line II-II in FIG. 1.
Figure 3:
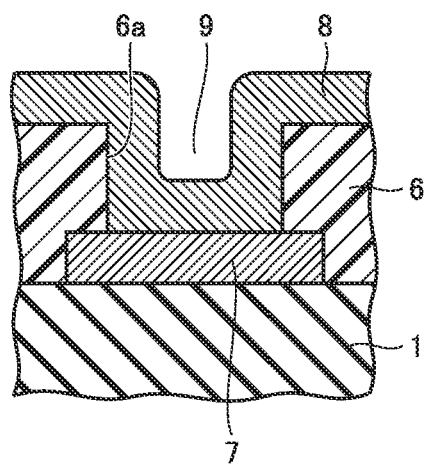
FIG. 3 is an enlarged view of a ground electrode and the vicinity thereof in FIG. 2.

A module according to a first embodiment of the present invention will be described with reference to FIGS. 1 to 3. FIG. 1 is a plan view of a module 101 according to the present embodiment. When viewed from above, module 101 is entirely covered with a shield film 8. FIG. 2 is a cross-sectional view taken along line II-II in FIG. 1.

Module 101 includes: a substrate 1 having a first face 1a; a plurality of components 3a, 3b, and 3c mounted on first face 1a; a resin film 6 that covers the plurality of components 3a, 3b, and 3c along the contours of the plurality of components 3a, 3b, and 3c and also covers a part of first face 1a; and shield film 8 formed to overlap resin film 6. Each of components 3a, 3b, and 3c is an electronic component. These components may be any of, for example, an IC, an inductor, a capacitor, and the like. The number, shape, and arrangement of illustrated components 3a, 3b, and 3c are merely examples, and are not limited thereto. Shield film 8 is a conductor film. Shield film 8 is formed by sputtering, for example. Shield film 8 may be a metal film. Shield film 8 may have a multilayer structure of a plurality of kinds of metal films. Shield film 8 may include, for example, stainless steel. Substrate 1 is formed by stacking a plurality of insulating layers 2 and integrating them. Substrate 1 may be a resin multilayer substrate. Substrate 1 may be a ceramic multilayer substrate. Insulating layer 2 may be a resin layer or a ceramic layer. Here, as an example, the explanation is continued assuming that substrate 1 is a ceramic multilayer substrate. Although the boundary lines between insulating layers are displayed in the drawings, actually, in a state after sintering in a ceramic multilayer substrate, the stacked insulating layers will be integrated and the boundary lines between insulating layers will be vanished.

A ground electrode 7 is provided on first face 1a. FIG. 3 is an enlarged view of ground electrode 7 and the vicinity thereof. Resin film 6 has an opening 6a, and shield film 8 is connected to ground electrode 7 via opening 6a. The surface of shield film 8 is recessed at a position corresponding to opening 6a. In other words, shield film 8 has a dot-shaped recess corresponding to opening 6a.

Resin film 6 can be formed by applying heat and pressure in a state where a sheet-shaped resin is placed so as to cover components 3a, 3b, and 3c. Due to the application of heat and pressure as described above, the sheet-shaped resin is softened and adheres to components 3a, 3b, and 3c along the three-dimensional contours of components 3a, 3b, and 3c with a substantially uniform thickness. As a result, components 3a, 3b, and 3c are collectively covered by resin film 6 along the contours of respective components 3a, 3b, and 3c. After resin film 6 is formed, shield film 8 is formed by sputtering from above resin film 6. In a case where there is a region where shield film 8 should not be formed, the region may be covered with a mask during sputtering.

The above-described structure can also be achieved by using a thermoplastic resin sheet such as LCP (liquid crystal polymer) or polyimide to which a copper foil subjected to rust-preventive treatment is attached, that is, a thermoplastic resin sheet with copper foil. In this case, a resin layer of the thermoplastic resin sheet with copper foil may be subjected to laser processing to provide an opening. Then, the thermoplastic resin sheet with copper foil may be put on components 3a, 3b, and 3c with the copper foil facing upward, and heat and pressure may be applied thereto. The resin used here is not limited to a thermoplastic resin, and may be a thermosetting resin.

In the present embodiment, shield film 8 is formed to overlap resin film 6 disposed along the contours of the plurality of components 3a, 3b, and 3c, that is, shield film 8 is provided in close contact with each of components 3a, 3b, and 3c with resin film 6 therebetween. Therefore, distance between each component and shield film 8 is extremely short. For example, when the resin film has a sheet shape, the distance between each component and the shield film can be set to several μm to tens of μm. Since the distance between each component and shield film 8 is extremely short, the shielding performance can be enhanced. In the present embodiment, shield film 8 is disposed at a position close to each component so as to follow the outer shape of each component while maintaining a certain distance from the surface of each component, whereby the occupied volume of entire module 101 can be reduced. Furthermore, in the present embodiment, the height of shield film 8 is not so different from the height of the component, whereby the height of entire module 101 can be reduced. As described above, in the present embodiment, the shielding performance of the module can be enhanced and the height can be reduced. As described in the present embodiment, the distance between shield film 8 and the surface of each of the plurality of components is preferably constant.

In FIG. 2, wiring inside substrate 1 is not illustrated. Commonly, wiring is disposed inside substrate 1 by a conductor pattern and a conductor via. The same applies to the following embodiments.

Second Embodiment

Figure 4:
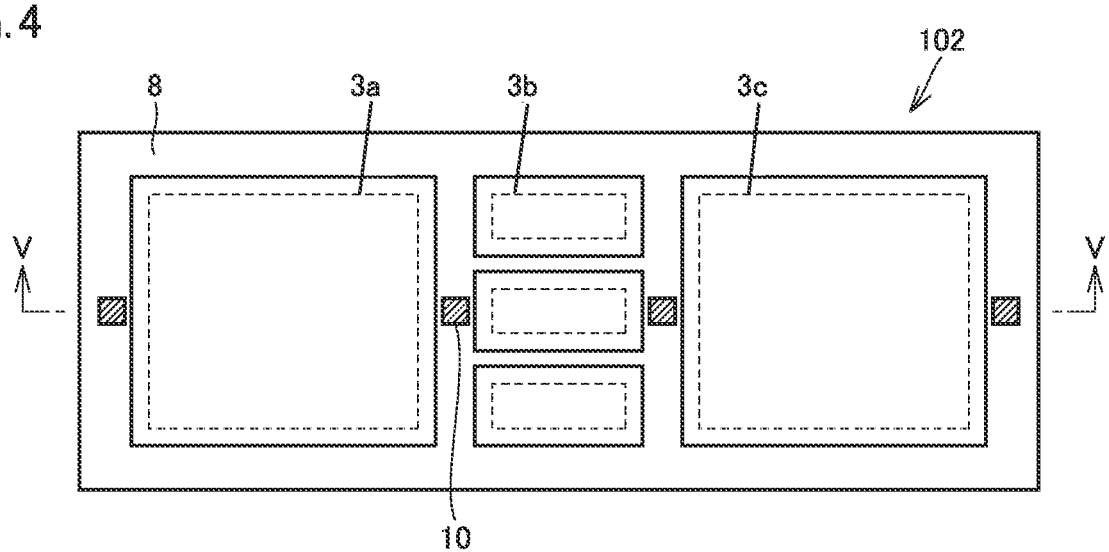
FIG. 4 is a plan view of a module according to a second embodiment of the present invention.
Figure 5:
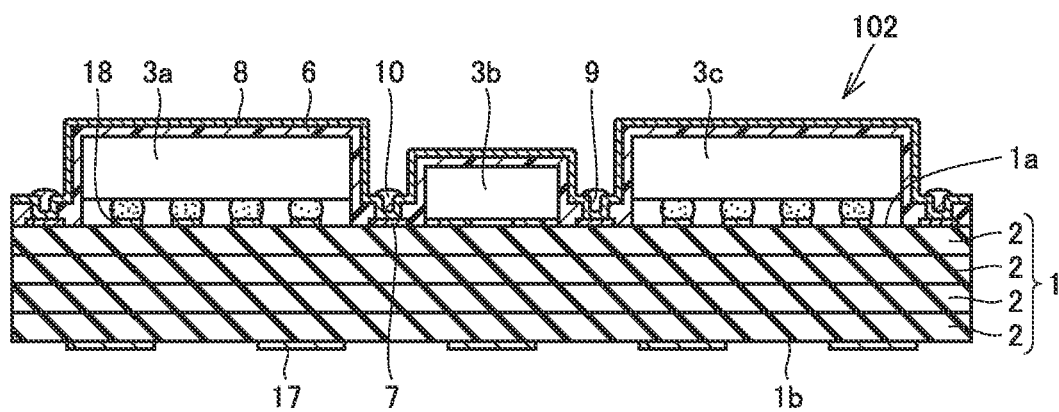
FIG. 5 is a cross-sectional view taken along line V-V in FIG. 4.
Figure 6:
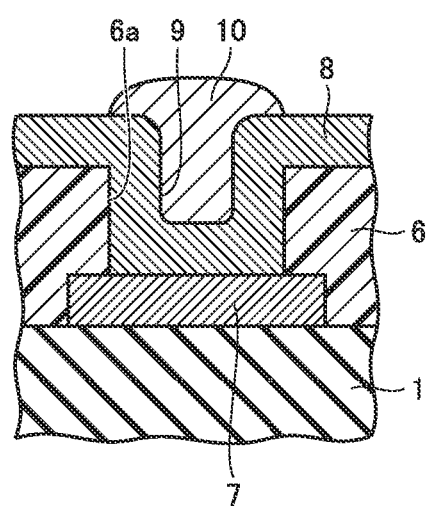
FIG. 6 is an enlarged view of a ground electrode and the vicinity thereof in FIG. 5.

A module according to a second embodiment of the present invention will be described with reference to FIGS. 4 to 6. FIG. 4 is a plan view of a module 102 according to the present embodiment. A plurality of conductive materials 10 is exposed on the upper surface of module 102. FIG. 5 is a cross-sectional view taken along line V-V in FIG. 4. FIG. 6 is an enlarged view of ground electrode 7 and the vicinity thereof in FIG. 5.

In opening 6a of resin film 6, conductive material 10 is disposed so as to cover a portion where ground electrode 7 and shield film 8 overlap. Conductive material 10 may be, for example, a metallic block or a low melting point metal. Conductive material 10 may be a metallic pin including a head portion having a large diameter and a body portion extending narrowly from the head portion. Conductive material 10 may be a metallic member having a tapered shape in which an upper end is thick and a lower end is thin. Conductive material 10 may be obtained by attaching a low melting point metal to a metallic block. The low melting point metal referred to herein may be, for example, solder.

The other configurations are similar to those described for module 101 in the first embodiment, and thus the description thereof will not be repeated.

In the present embodiment, conductive material 10 is disposed so as to cover a portion where ground electrode 7 and shield film 8 overlap with each other, so that more reliable electrical connection can be achieved between ground electrode 7 and shield film 8. Shield film 8 may have a thinned portion or broken portion. Even if the film formation condition of shield film 8 is slightly poor, the total thickness as a conductor can be increased by adding conductive material 10, and electrical connection can be ensured.

Third Embodiment

Figure 7:
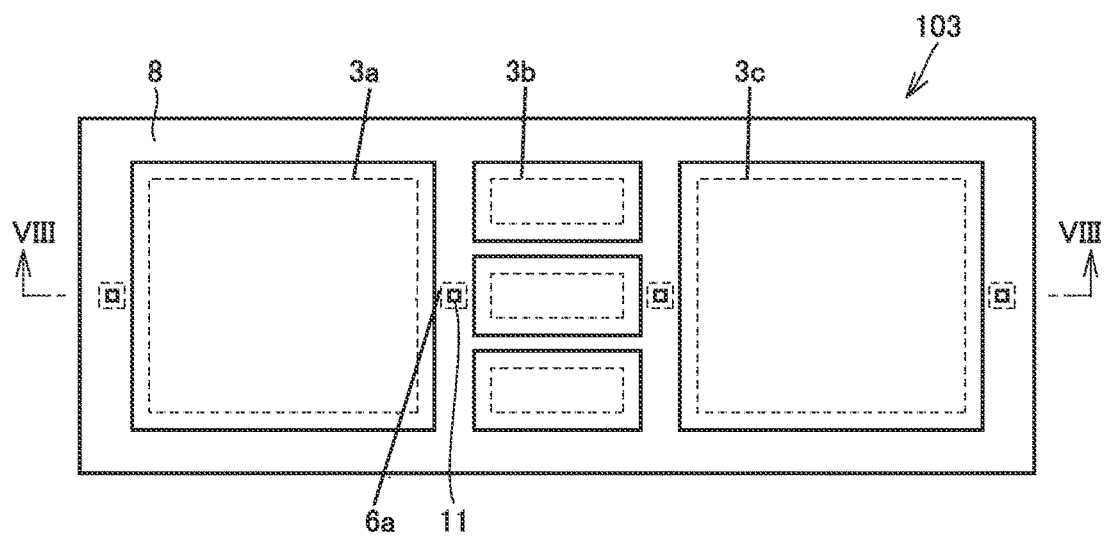
FIG. 7 is a plan view of a module according to a third embodiment of the present invention.
Figure 8:
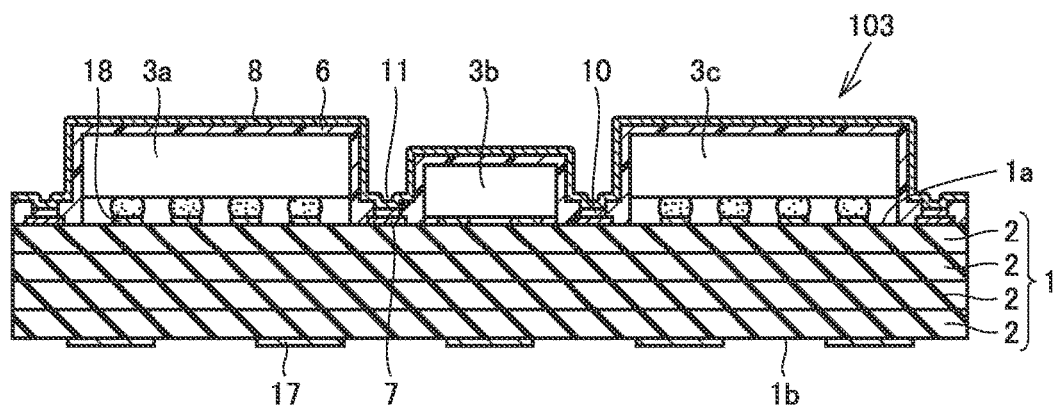
FIG. 8 is a cross-sectional view taken along line VIII-VIII in FIG. 7.
Figure 9:
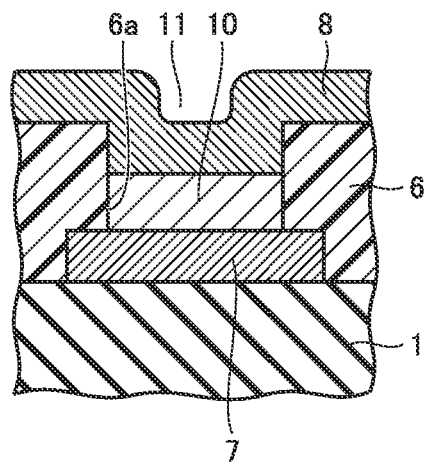
FIG. 9 is an enlarged view of a ground electrode and the vicinity thereof in FIG. 8.

A module according to a third embodiment of the present invention will be described with reference to FIGS. 7 to 9. FIG. 7 is a plan view of a module 103 according to the present embodiment. Module 103 has a plurality of marks 11 on the upper surface. FIG. 8 is a cross-sectional view taken along line VIII-VIII in FIG. 7. FIG. 9 is an enlarged view of ground electrode 7 and the vicinity thereof in FIG. 8.

In opening 6a of resin film 6, conductive material 10 is interposed between ground electrode 7 and shield film 8. Conductive material 10 may be, for example, a metallic block or a low melting point metal. Conductive material 10 may be obtained by attaching a low melting point metal to a metallic block. The low melting point metal referred to herein may be, for example, solder. The other configurations are similar to those described for module 101 in the first embodiment, and thus the description thereof will not be repeated.

In the example shown here, mark 11 is a recess appearing in shield film 8 covering conductive material 10. Depending on an amount of conductive material 10 disposed in opening 6a, mark 11 may be the same in height as other portions. In that case, mark 11 may not be clearly visible. When an amount of conductive material 10 disposed in one opening 6a is large, mark 11 may appear as a protrusion.

In the present embodiment, conductive material 10 is interposed between ground electrode 7 and shield film 8, so that more reliable electrical connection can be achieved between ground electrode 7 and shield film 8.

Figure 10:
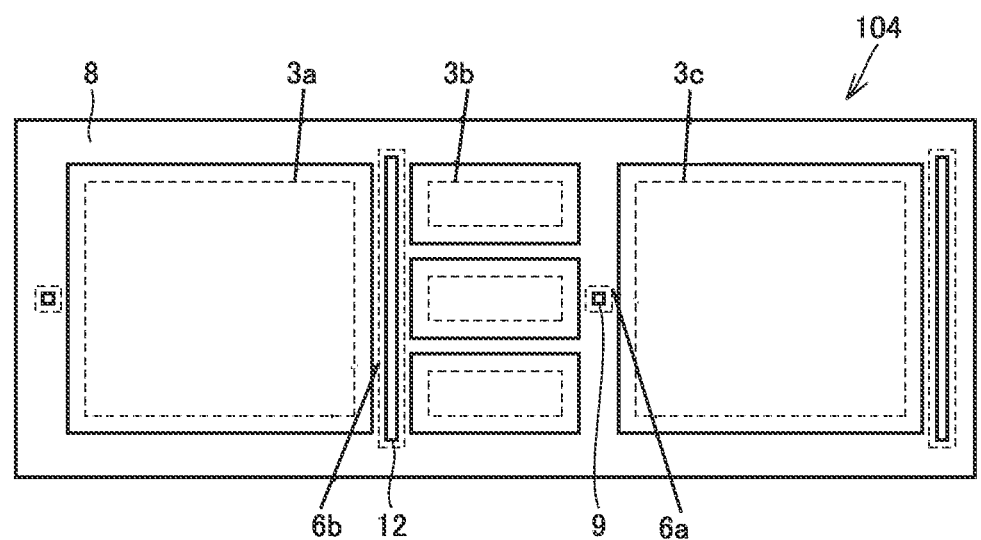
FIG. 10 is a plan view of a module according to a first modification of the third embodiment of the present invention.

The first to third embodiments have described an example in which opening 6a provided in resin film 6 has a square shape, and the plurality of openings 6a is arranged in a row on the center line of the module when the module is viewed from above. However, the shape of opening 6a is not limited to a square. For example, a module 104 illustrated in FIG. 10 may be used. In module 104, shield film 8 has linear recess 12 in addition to dot-shaped recess 9. Linear recess 12 is formed corresponding to a linear opening 6b. A linear ground electrode is disposed at the position of linear recess 12. As described above, when resin film 6 has linear opening 6b, shield film 8 and the ground electrode can be electrically connected over a wide area, so that the shielding performance can be enhanced.

Figure 11:
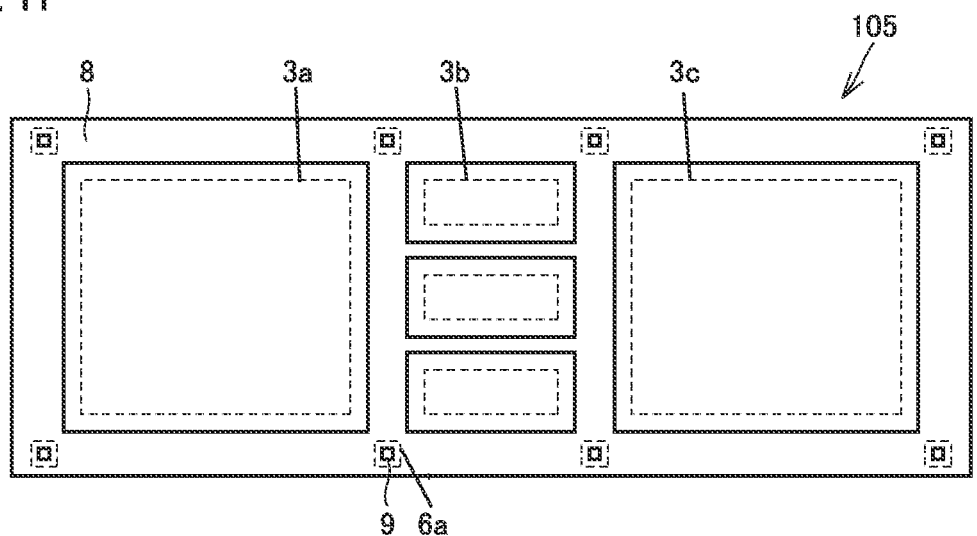
FIG. 11 is a plan view of a module according to a second modification of the third embodiment of the present invention.

For example, a module 105 illustrated in FIG. 11 may be used. In module 105, dot-shaped recesses 9 are arranged in two rows instead of one row. By adopting this configuration, shield film 8 can be connected to the ground electrode at many locations, so that the shielding performance can be improved.

Notably, opening 6a is preferably located between the plurality of components in all of the first to third embodiments. This configuration can electrically isolate the plurality of components from each other by shield film 8. Thus, compartment shielding can be easily achieved.

Figure 12:
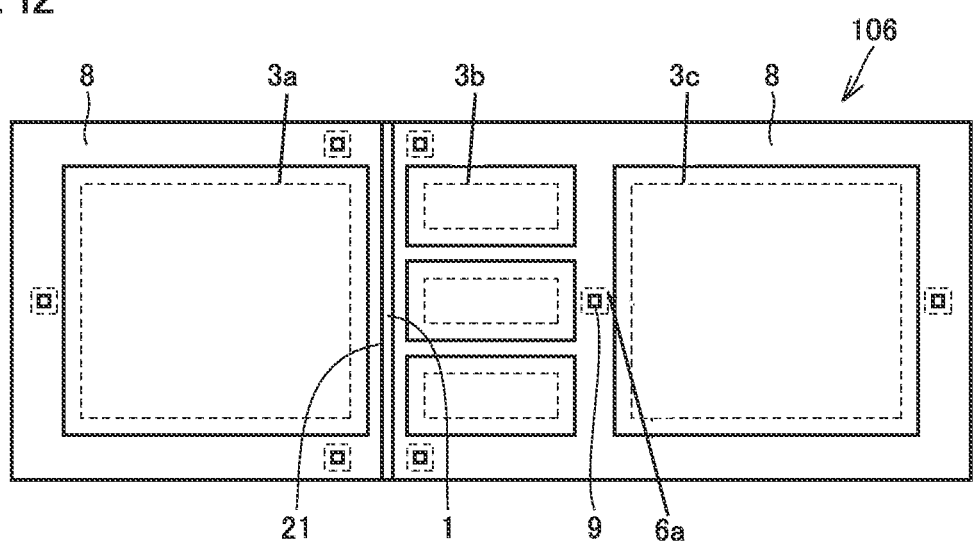
FIG. 12 is a plan view of a module according to a third modification of the third embodiment of the present invention.

For example, a module 106 illustrated in FIG. 12 may be used. In module 106, resin film 6 and shield film 8 are completely separated in the middle by a slit 21. Substrate 1 is exposed inside slit 21.

Figure 13:
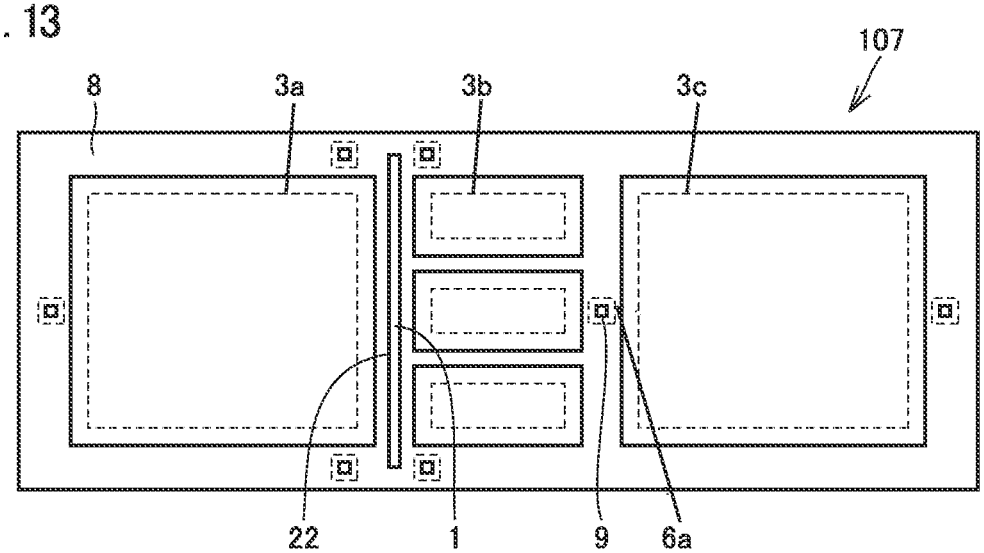
FIG. 13 is a plan view of a module according to a fourth modification of the third embodiment of the present invention.

For example, a module 107 illustrated in FIG. 13 may be used. In module 107, shield film 8 is separated in the middle by a slit 22. However, it is not completely separated, but partially connected. In the example shown here, shield film 8 is connected at a total of two points at both ends in the width direction.

Here, as described with reference to FIGS. 12 and 13, the module may have a configuration in which shield film 8 is separated by the slit. The wording "separated by a slit" as used herein includes not only a configuration in which the shield film is completely separated as illustrated in FIG. 12 but also a configuration in which the shield film is separated with a portion partially connected being left as illustrated in FIG. 13.

Fourth Embodiment

Figure 14:
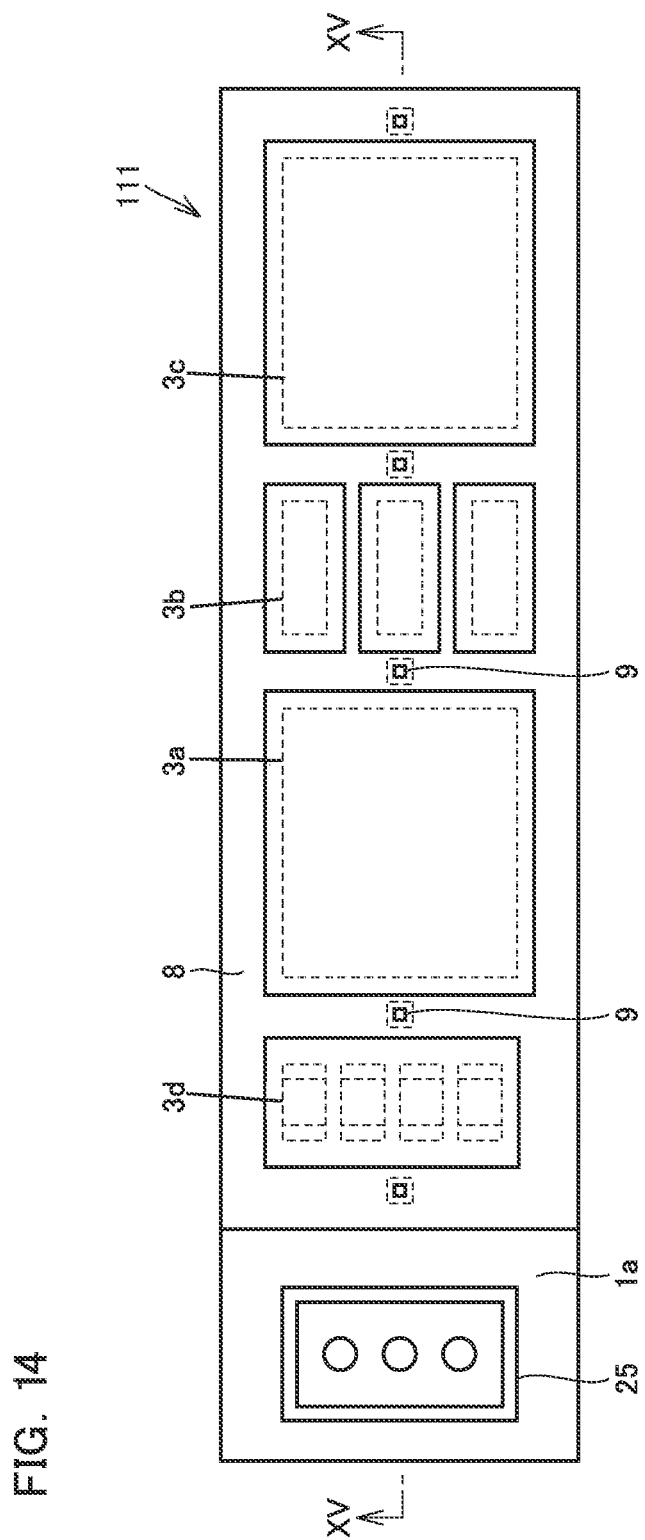
FIG. 14 is a plan view of a module according to a fourth embodiment of the present invention.
Figure 15:
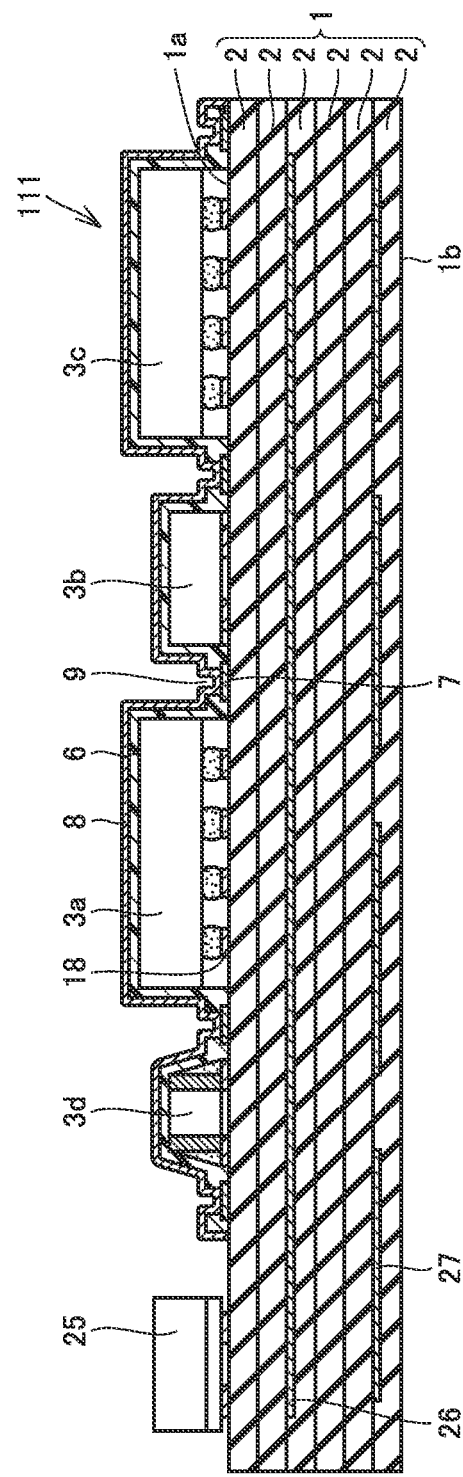
FIG. 15 is a cross-sectional view taken along line XV-XV in FIG. 14.

A module according to a fourth embodiment of the present invention will be described with reference to FIGS. 14 and 15. FIG. 14 is a plan view of a module 111 according to the present embodiment. FIG. 15 is a cross-sectional view taken along line XV-XV in FIG. 14. Module 111 includes a connector 25 at one end. In module 111, first face 1a of substrate 1 is exposed at one end having connector 25. Shield film 8 is not formed at this end. The entire upper surface of module 111 except for this end is covered with shield film 8. Module 111 includes components 3a, 3b, 3c, and 3d. These components are covered with resin film 6, and resin film 6 is covered with shield film 8.

Module 111 includes an antenna 27 as illustrated in FIG. 15. Antenna 27 is formed of a conductor film and is disposed inside substrate 1. Antenna 27 is disposed in the vicinity of a second face 1b inside substrate 1. A conductor pattern 26 is disposed inside substrate 1. Antenna 27 and components 3a, 3b, 3c, and 3d are separated by conductor pattern 26. Conductor pattern 26 is grounded by wiring (not illustrated). Conductor pattern 26 is also referred to as a "ground conductor". Antenna 27 is a patch antenna.

The other configurations are similar to those described in the first embodiment.

The effects described in the first embodiment can also be obtained in the present embodiment. Furthermore, module 111 in the present embodiment includes antenna 27. Since the module according to the present embodiment has enhanced shielding performance for components in the module as described above, antenna performance can be improved. In addition, the height of the antenna module can be reduced and the occupied volume can be reduced, whereby a degree of freedom in design can be improved.

As described in the present embodiment, it is preferable that substrate 1 has second face 1b as a face reverse to first face 1a, and antenna 27 is disposed inside substrate 1 along second face 1b. With this configuration, antenna 27 can easily transmit and receive electromagnetic waves through second face 1b, so that satisfactory communication can be performed.

Fifth Embodiment

Figure 16:
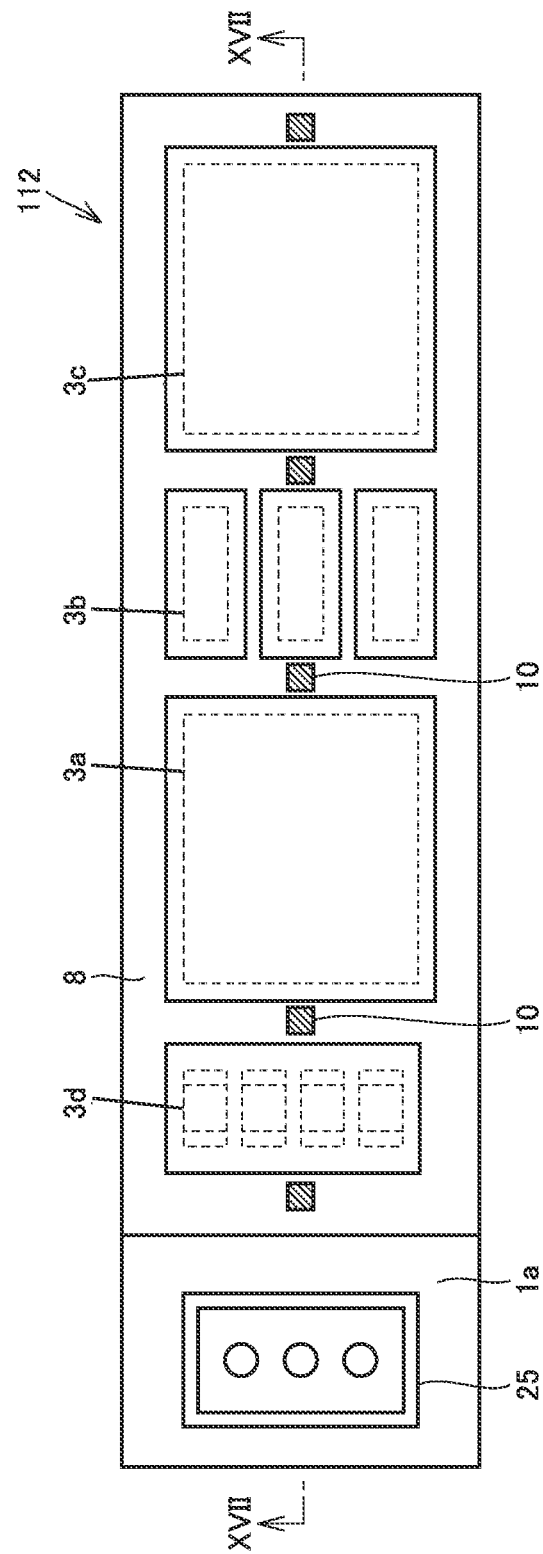
FIG. 16 is a plan view of a module according to a fifth embodiment of the present invention.
Figure 17:
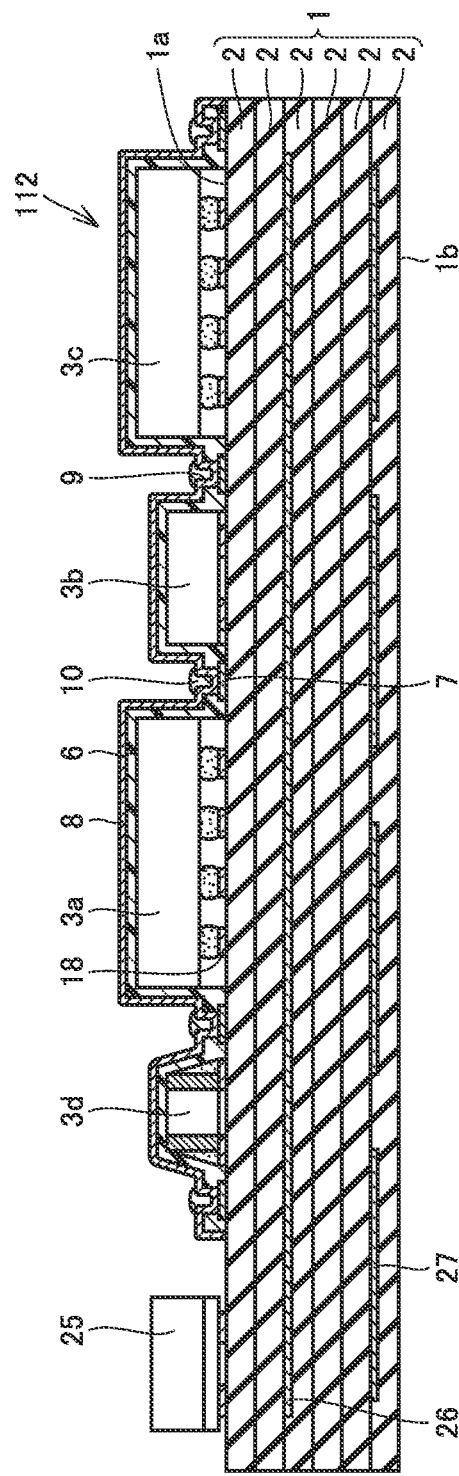
FIG. 17 is a cross-sectional view taken along line XVII-XVII in FIG. 16.

A module according to a fifth embodiment of the present invention will be described with reference to FIGS. 16 and 17. FIG. 16 is a plan view of a module 112 according to the present embodiment. FIG. 17 is a cross-sectional view taken along line XVII-XVII in FIG. 16. The basic configuration of module 112 is similar to module 111 described in the fourth embodiment. Module 112 includes a portion where conductive material 10 is exposed on the upper surface. Conductive material 10 is as described in the second embodiment. As described in the second embodiment, module 112 in the present embodiment includes: conductive material 10 that covers the portion where ground electrode 7 and shield film 8 overlap in opening 6a of resin film 6; and antenna 27 as described in the fourth embodiment.

The effects described in the second embodiment can also be obtained in the present embodiment. Furthermore, module 112 in the present embodiment includes antenna 27. Since the module according to the present embodiment has enhanced shielding performance for components in the module as described above, antenna performance can be improved. In addition, the height of the antenna module can be reduced and the occupied volume can be reduced, whereby a degree of freedom in design can be improved.

Sixth Embodiment

Figure 18:
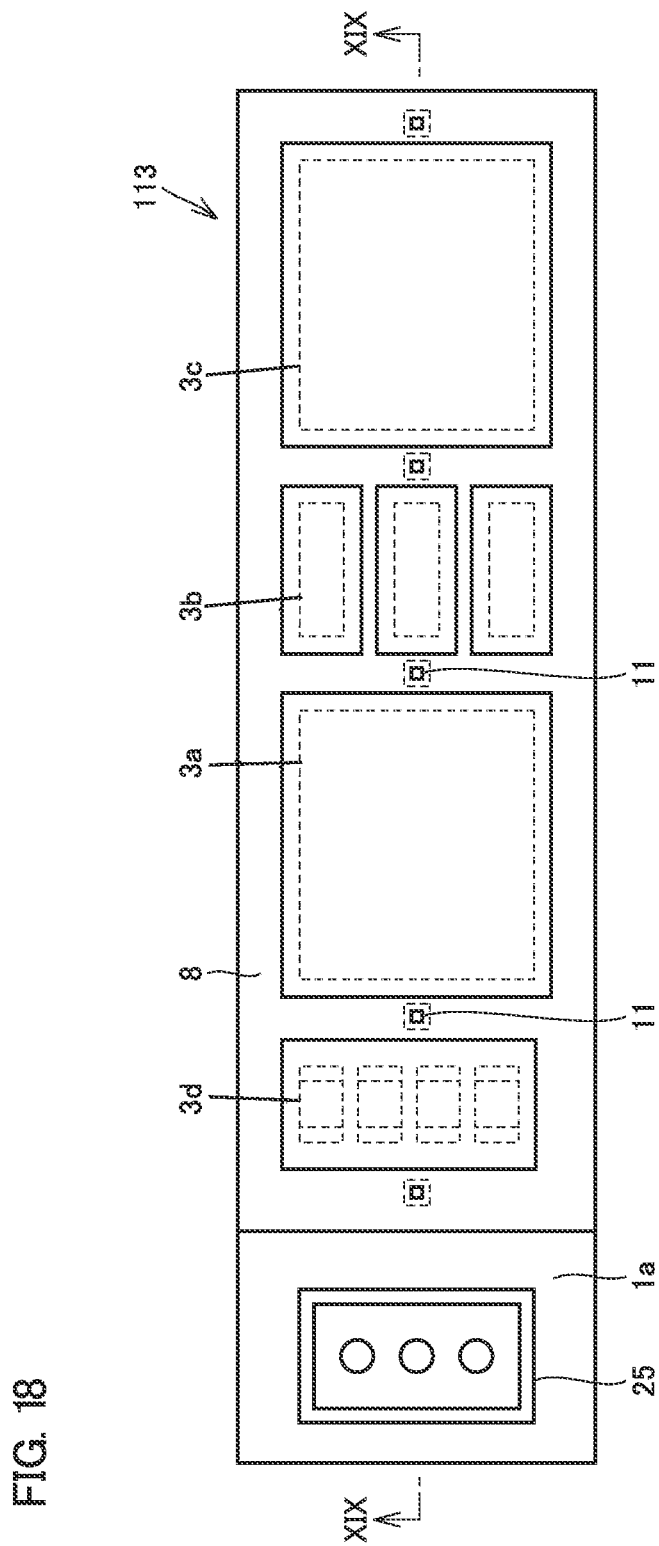
FIG. 18 is a plan view of a module according to a sixth embodiment of the present invention.
Figure 19:
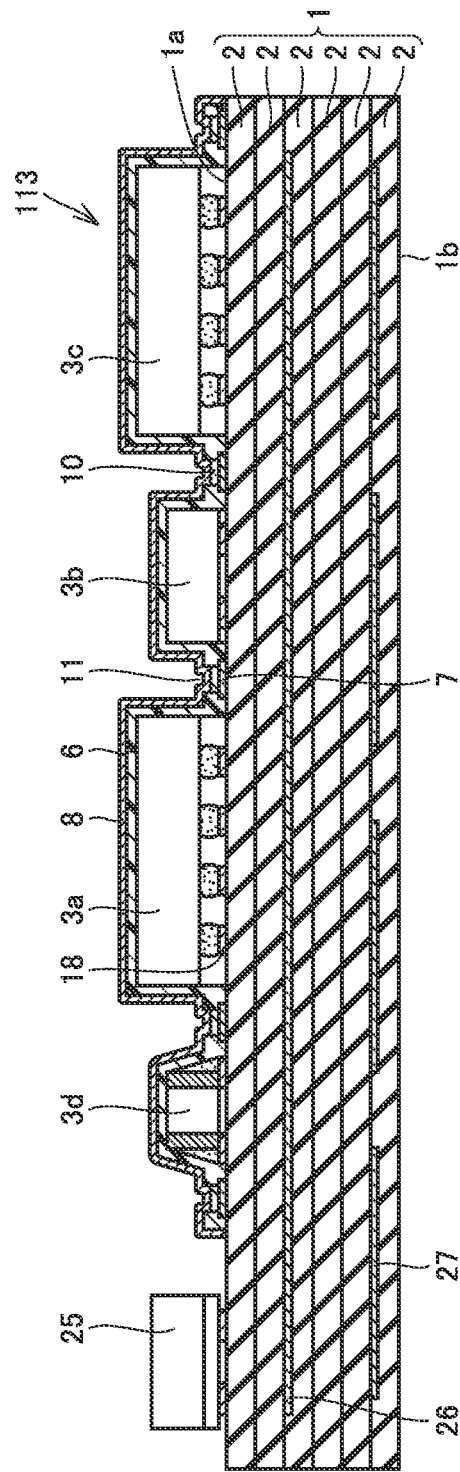
FIG. 19 is a cross-sectional view taken along line XIX-XIX in FIG. 18.

A module according to a sixth embodiment of the present invention will be described with reference to FIGS. 18 and 19. FIG. 18 is a plan view of a module 113 according to the present embodiment. FIG. 19 is a cross-sectional view taken along line XIX-XIX in FIG. 18. The basic configuration of module 113 is similar to module 111 described in the fourth embodiment. Module 113 has marks 11 on the upper surface. Mark 11 is as described in the third embodiment. As described in the third embodiment, module 113 in the present embodiment includes: conductive material 10 interposed between ground electrode 7 and shield film 8 in opening 6a of resin film 6; and antenna 27 as described in the fourth embodiment.

The effects described in the third embodiment can also be obtained in the present embodiment. Furthermore, module 113 in the present embodiment includes antenna 27. Since the module according to the present embodiment has enhanced shielding performance for components in the module as described above, antenna performance can be improved. In addition, the height of the antenna module can be reduced and the occupied volume can be reduced, whereby a degree of freedom in design can be improved.
(Modification)

Figure 20:
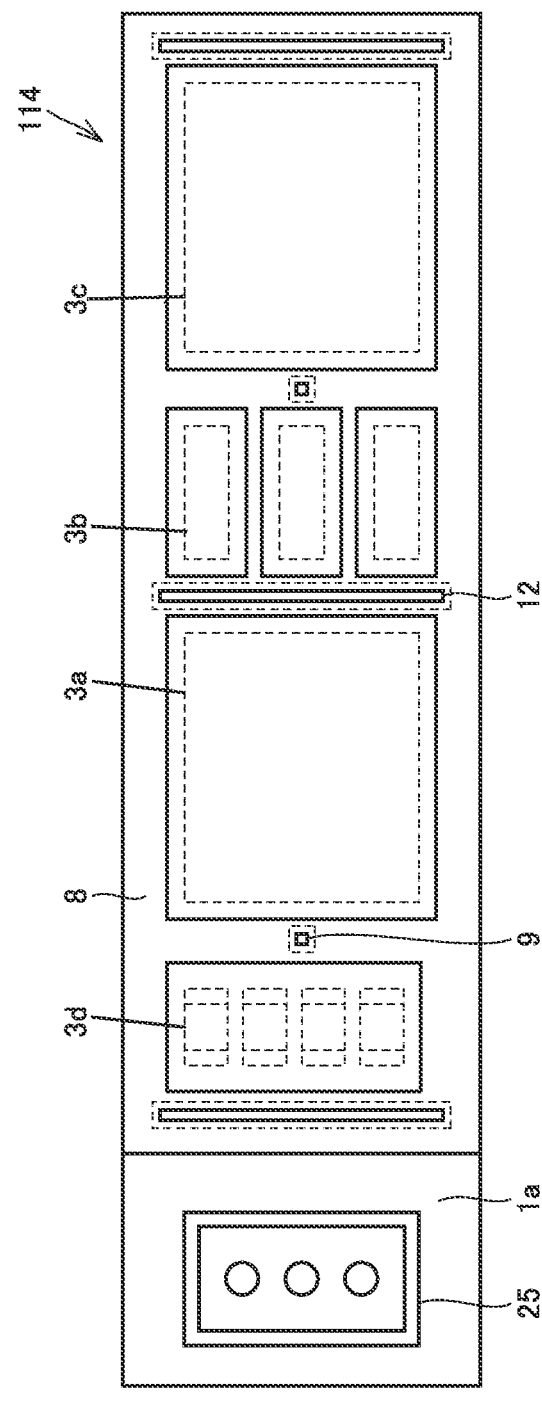
FIG. 20 is a plan view of a module according to a first modification of the fourth embodiment of the present invention.

As a modification of module 111 described in the fourth embodiment, a module 114 illustrated in FIG. 20 may be used. Module 114 has dot-shaped recess 9 and linear recess 12.

Figure 21:
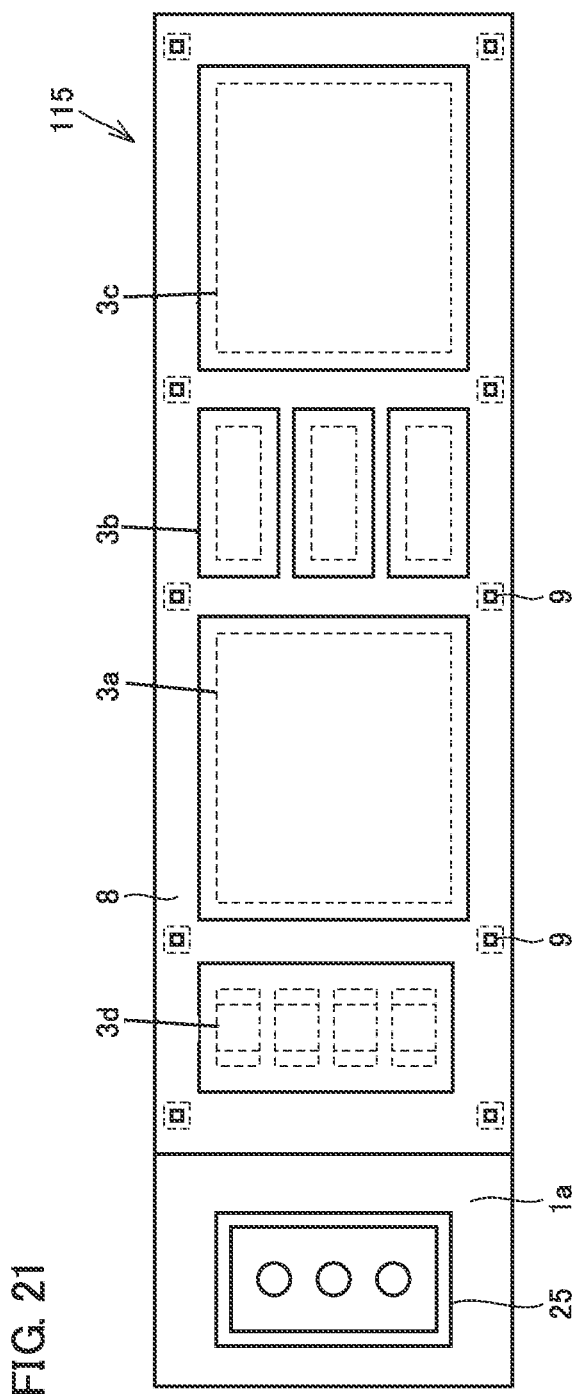
FIG. 21 is a plan view of a module according to a second modification of the fourth embodiment of the present invention.

As still another modification, a module 115 illustrated in FIG. 21 may be used. In module 115, dot-shaped recesses 9 are arranged in two rows instead of one row.

Figure 22:
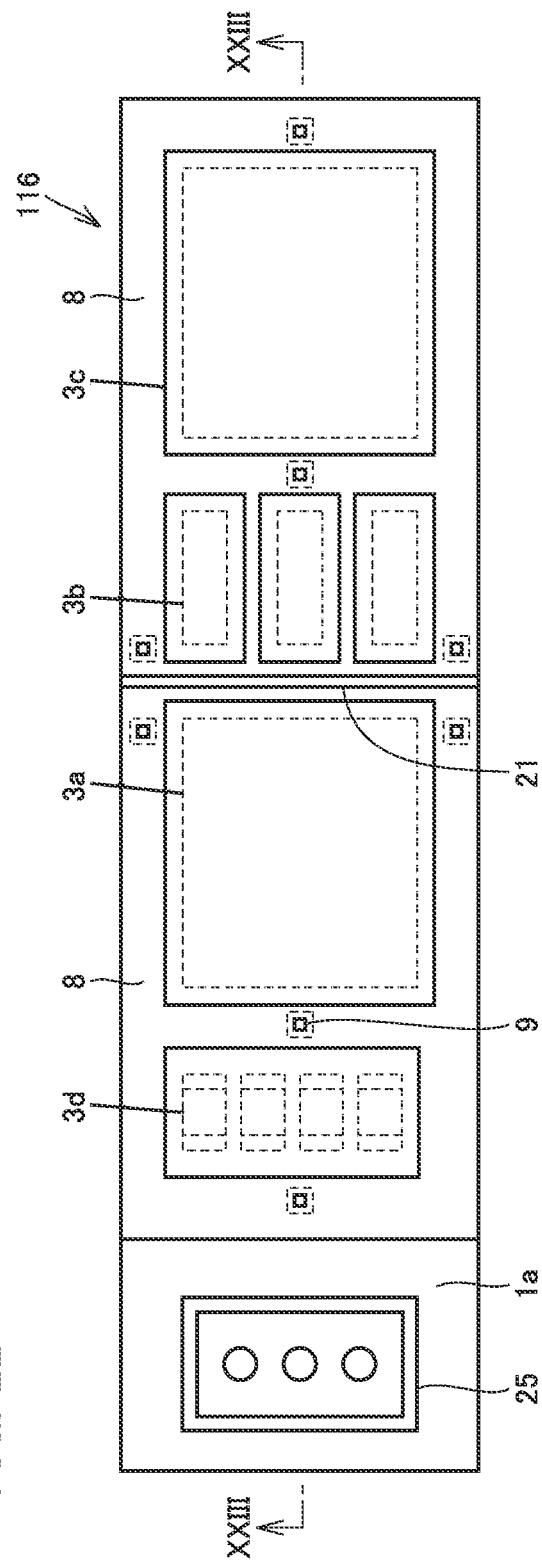
FIG. 22 is a plan view of a module according to a third modification of the fourth embodiment of the present invention.
Figure 23:
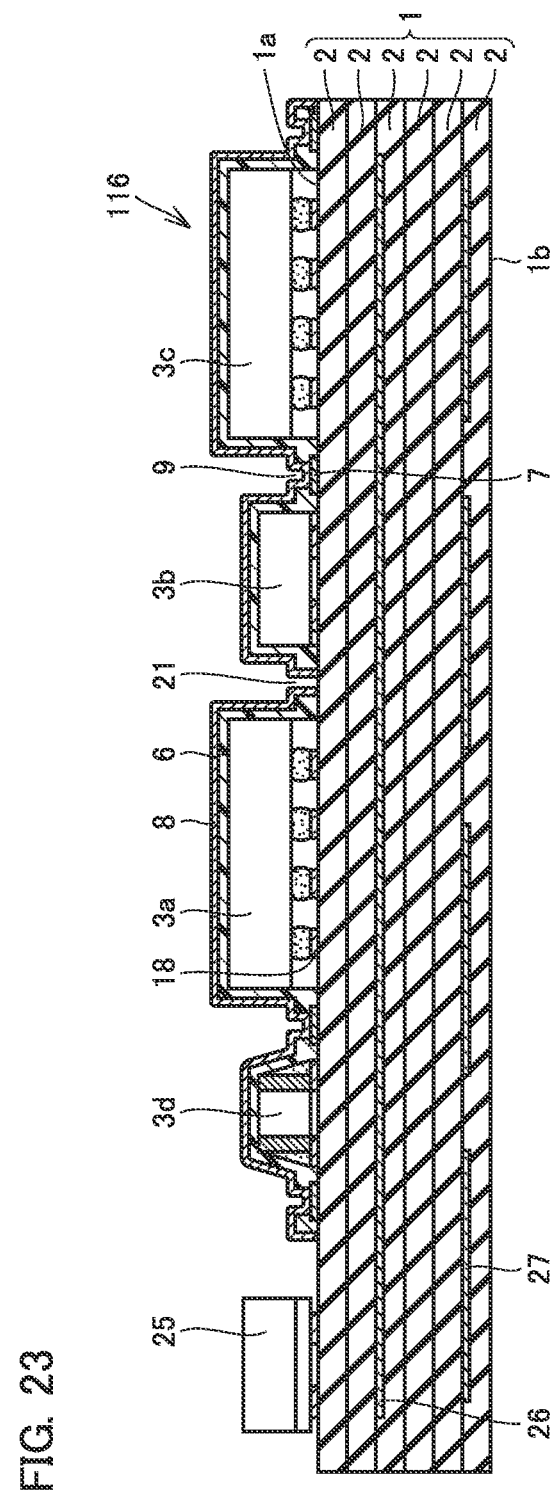
FIG. 23 is a cross-sectional view taken along line XXIII-XXIII in FIG. 22.

As still another modification, a module 116 illustrated in FIG. 22 may be used. FIG. 23 is a cross-sectional view taken along line XXIII-XXIII in FIG. 22. In module 116, resin film 6 and shield film 8 are completely separated in the middle by slit 21.

Figure 24:
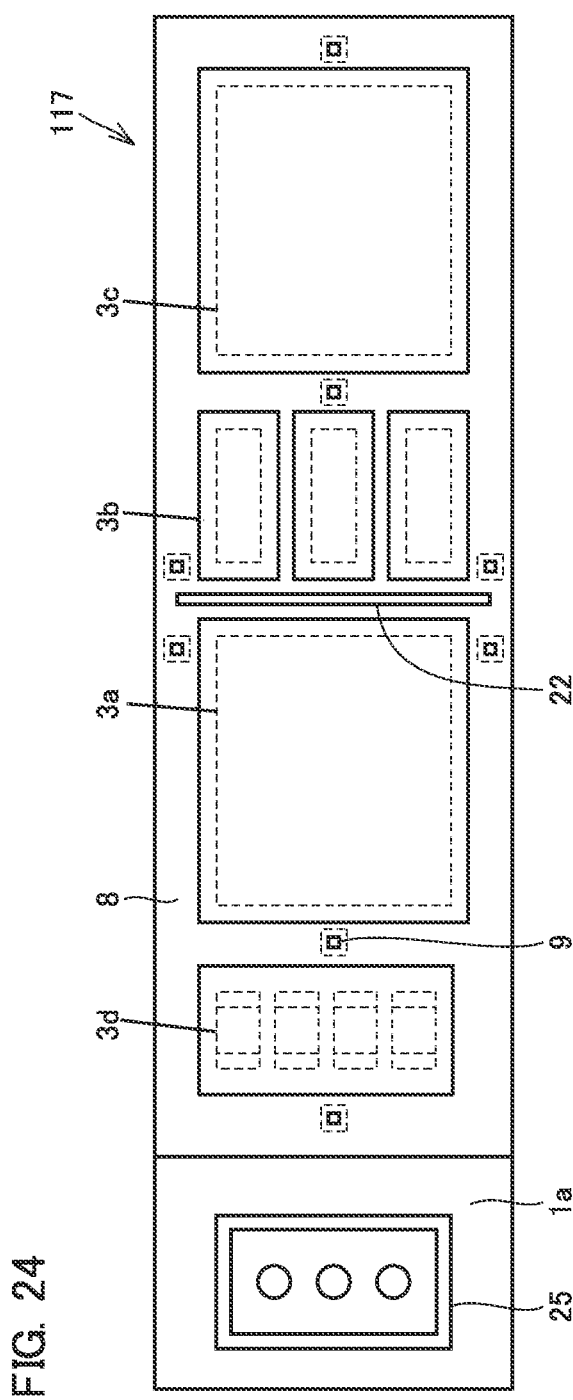
FIG. 24 is a plan view of a module according to a fourth modification of the fourth embodiment of the present invention.

As still another modification, a module 117 illustrated in FIG. 24 may be used. In module 117, shield film 8 has slit 22. Slit 22 is similar to that described at the end of the third embodiment.

Here, the modifications of module 111 described in the fourth embodiment has been described. However, modifications of modules 112 and 113 described in the fifth and sixth embodiments can be similarly adjusted and assumed.

Note that a plurality of the above embodiments may be appropriately combined and adopted.

It should be understood that the embodiments disclosed herein are illustrative in all respects and not restrictive. The scope of the present invention is defined by the claims, and is intended to include meanings equivalent to the claims and all modifications within the scope.

1: substrate, 1a: first face, 1b: second face, 2: insulating layer, 3a, 3b, 3c: component, 6: resin film, 6a, 6b: opening, 7: ground electrode, 8: shield film, 9, 12: recess, 10: conductive material, 11: mark, 17: external terminal, 18: pad electrode, 21, 22: slit, 25: connector, 26: conductor pattern, 27: antenna, 101, 102, 103, 104, 105, 106, 107, 111, 112, 113, 114, 115, 116, 117: module

The invention claimed is:

1. A module comprising:
a substrate having a first face;
a plurality of components mounted on the first face;
a resin film covering the plurality of components along contours of the plurality of components and also covering a part of the first face; and
a shield film provided to overlap the resin film,
wherein the first face is provided with a ground electrode, the resin film has an opening,
the shield film is connected to the ground electrode via the opening,
the shield film has a dot-shaped recess corresponding to the opening,
the shield film is separated by a slit, and wherein the first face of the substrate is exposed to an outside of said module via said slit, and
the slit is provided in a region where a two-layer structure comprising the resin film and the shield film covers the first face of the substrate directly.

2. The module according to claim 1, wherein a distance between the shield film and a surface of each of the plurality of components is constant.

3. The module according to claim 1, wherein the module has a conductive material disposed in the opening of the resin film so as to cover a portion where the ground electrode and the shield film overlap.

4. The module according to claim 1, wherein the module has a conductive material interposed between the ground electrode and the shield film in the opening of the resin film.

5. The module according to claim 1, wherein the opening is located between the plurality of components.

6. The module according to claim 1, further comprising an antenna.

7. The module according to claim 6, wherein the substrate has a second face as a face opposite to the first face, and the antenna is disposed inside the substrate along the second face.

8. The module according to claim 2, wherein the module has a conductive material disposed in the opening of the resin film so as to cover a portion where the ground electrode and the shield film overlap.

9. The module according to claim 2, wherein the module has a conductive material interposed between the ground electrode and the shield film in the opening of the resin film.

10. The module according to claim 2, wherein the opening is located between the plurality of components.

11. The module according to claim 3, wherein the opening is located between the plurality of components.

12. The module according to claim 4, wherein the opening is located between the plurality of components.

13. The module according to claim 2, further comprising an antenna.

14. The module according to claim 3, further comprising an antenna.

15. The module according to claim 4, further comprising an antenna.

16. The module according to claim 1, wherein the ground electrode has a first surface, said first surface facing a same direction as said first face, wherein said resin contacts opposite, first and second end portions of the ground electrode at said first face, and wherein said shield film contacts an intermediate portion of the ground electrode, disposed between said first and second end portions, at said first face.

17. The module according to claim 1, wherein said ground electrode is a single element that extends between two adjacent components of said plurality of components.

18. The module according to claim 17, wherein the ground electrode has a first surface, said first surface facing a same direction as said first face, wherein said resin contacts opposite, first and second end portions of the ground electrode at said first face, and wherein said shield film contacts an intermediate portion of the ground electrode, disposed between said first and second end portions, at said first face.

19. The module according to claim 1, wherein said opening is defined by first and second portions having first and second widths, respectively, said first portion being positioned closer to the first face than the second portion, wherein said first width is smaller than said second width, and wherein said dot-shaped recess is located in the first portion.

* * * * *